United States Patent [19]

Kumagai

[11] Patent Number: 4,654,750

[45] Date of Patent: Mar. 31, 1987

[54] FUNCTIONAL SUBSTRATE AND ELECTRONIC CIRCUIT SUBSTRATE USING THE SAME

[75] Inventor: Motoo Kumagai, Yokohama, Japan

[73] Assignee: Canon Kabushiki Kaisha, Tokyo, Japan

[21] Appl. No.: 736,341

[22] Filed: May 21, 1985

[30] Foreign Application Priority Data

May 24, 1984 [JP] Japan .................................. 59-103665

[51] Int. Cl.⁴ .......................... H01G 4/12; H01G 7/00
[52] U.S. Cl. .................................... 361/321; 29/25.42
[58] Field of Search ............... 361/320, 321; 29/25.42; 501/137; 351/10

[56] References Cited

U.S. PATENT DOCUMENTS 4,151,579 4/1979 Stark ..................................... 361/308
4,528,613 7/1985 Stetson et al. ....................... 361/321

FOREIGN PATENT DOCUMENTS 1565748 4/1980 United Kingdom .

OTHER PUBLICATIONS

Chance et al., "A Ceramic Capacitor Substrate for High Speed Switching VLSI Chips," 1982 IEEE.
Venkatachalam, "Pulse Propagation Properties of Multilayer Ceramic Multichip Modules for VLSI Circuits," 1983 IEEE.

Primary Examiner—Michael L. Gellner
Assistant Examiner—Douglas S. Lee
Attorney, Agent, or Firm—Fitzpatrick, Cella, Harper & Scinto

[57] ABSTRACT

A functional substrate is produced by forming a diffusion source for fabricating an electronic part in a ceramic substrate which has been made semiconductive by a sintering and subjecting the ceramic substrate to a firing to give plural electronic-part-forming units, isolated from one another, in the ceramic substrate. An electronic circuit comprises the functional substrate and at least electrodes for the electronic-part-forming units.

16 Claims, 6 Drawing Figures

FUNCTIONAL SUBSTRATE AND ELECTRONIC CIRCUIT SUBSTRATE USING THE SAME

BACKGROUND OF THE INVENTION

1. Field of the Invention

The present invention relates to a functional substrate and an electronic circuit substrate using it.

2. Description of the Prior Art

Heretofore, an insulator substrate on which conductive circuits and resistors are mounted has been mainly employed as a substrate for an electronic circuit using ceramics, and electronic parts such as capacitor and the like have been mainly used as a chip part mounted on an insulator substrate. An example of such a substrate for an electronic circuit is illustrated in FIG. 1, wherein 1 is a ceramic insulator substrate, 2 a conductive circuit, 3 a resistor, 4 an insulator layer for a cover, and 5 a chip capacitor.

However, when chip parts such as a capacitor and the like are mounted on the outside of a substrate as in FIG. 1, the substrate becomes bulky, and guaranteeing a mounting site for the chip part inevitably restricts design of circuits. As a result, the recent requirement for miniaturization of electronic circuits is not sufficiently satisfied.

On the other hand, there has been developed the following technique for fabricating capacitors as electronic parts using ceramics: A material of the barium titanate series sintered ceramics is subjected to a sintering operation together with impurities to render them semiconductive followed by a firing using metal or metal oxide diffusion source to give dielectrics and then a solid capacitor is produced. However, while such capacitors, can be used as chips, but there has not yet been established a technique which permits a plurality of capacitors to be built-in in a circuit substrate, and therefore, the capacitor does not sufficiently contribute to miniaturizing circuit substrates.

Recently, as the technique concerning a laminated ceramic capacitor is extended, one of the abovementioned capacitor parts has the form of a substrate having a built-in capacitor therein and a conductive circuit and a resistor on the surface. In that type of substrate, however, the characteristic range of a built-in capacitor is restricted by dielectrics constituting the substrate. When the circuit constant is within the restriction range, the substrate is very effective for miniaturizing an electronic circuit.

But, there are serious defects concerning the substrate.

First, one of the defects is high cost. In other words, procedure for forming the capacitor comprises laminating ceramics, and production facilities becomes complex, and hence many steps are required. It is, also, required to use a lot of relatively expensive electrode materials.

Second, there is a defect concerning the construction of the circuit.

To form plural capacitor-forming units in the same substrate, referring circuit constant, the units should be constructed by combining plural dielectrics depending on the circuit constant and laminating. Therefore, there exist defects in miniaturizing a circuit and in the degree of freedom available in designing a circuit, and hence fields of circuit the fields to which the circuit can feasibly be applied are limited.

Third, it is necessary for a laminated ceramic capacitor to have two through-holes per capacitor, and hence this type of substrate having built-in capacitors has a lot of through-holes. Consequently, the substrate has, also, defect that the surface area increases with through-holes.

FIG. 2 is an example of the type of ceramic substrate, wherein 1-3 have the same meaning, respectively as described in FIGS. 1, 6 and 7 are constitution units of built-in laminated capacitors in a substrate, 8 is a chip part mounted on a substrate, 9 is a through-hole.

In view of the foregoing, in the case of improving laminated ceramic capacitors and forming plural built-in capacitors in a substrate, there are serious limitations not only concerning cost but also concerning miniaturization of the circuit and degree of freedom for designing circuits.

SUMMARY OF THE INVENTION

It is an object of the present invention to provide a functional substrate which contains plural electronic-part-forming units in a single substrate and where characteristics of each electronic-part-forming unit can be widely selected, and an electronic circuit substrate using it.

Another object of the present invention is to provide a functional substrate which is inexpensive and can achieve miniaturizing an electronic circuit and extending the degree of freedom of an electronic circuit design, and an electronic circuit substrate using it. According to one aspect of the present invention, there is provided a functional substrate produced by a process which comprises forming a diffusion source for fabricating an electronic part on the surface of a ceramic substrate which has been made semiconductive by a sintering and subjecting the ceramic substrate to a firing to give plural electronic-part-forming units, isolated from one another, in the ceramic substrate.

According to another aspect of the present invention, there is provided an electronic circuit substrate comprising the above-mentioned functional substrate and at least electrodes for the electronic-part-forming units.

DESCRIPTION OF THE PREFERRED EMBODIMENT

In fabricating a functional substrate or an electronic circuit substrate, electronic-part-constituting units can be selected from various kinds of capacitors, resistors, insulators, diodes, transistors and the like. Two or more electronic-part-constituting units may be formed in one substrate. In addition, there can be utilized various ceramic substrates capable of being rendered semiconductive depending on the electronic-part-constituting unit to be formed.

Examples of the present invention are described below as to a functional substrate and an electronic circuit substrate where plural capacitor-constituting units are formed in a ceramic substrate. Embodiments of the present invention, however, are not restricted to this illustration.

In forming a capacitor-constituting unit, a ceramic substrate as a base may be composed of barium titanate, strontium titanate or compound oxides thereof. For example, there may be used $BaTiO_3$, $SrTiO_3$, $(Ba, Sr)(Ti, Sn) O_3$ series of compound oxides (including solid solution), $(Ba, Sr) TiO_3$ series of compound oxides (including solid solution), $(Mg, Sr, Ca) TiO_3$ series of compound oxides (including solid solution), and the like. Conventional procedures are available to obtain a semiconductive substrate by sintering of those oxides or compound oxides, for example, mixing powders of component oxides and impurities (trace additives) such as $Dy_2O_3$, $SiO_2$, $CuO$, $BaCO_3$, $Al_2O_3$, $SrO$, $MnO$ and the like, capable of rendering a substrate semiconductive, then compacting and further sintering to a sintered body usually having an appropriate binding degree among particles.

Figure 1:
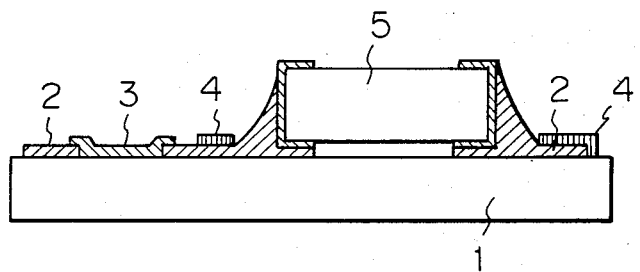
FIGS. 1 and 2 illustrate a structure of conventional circuit substrate.
Figure 2:
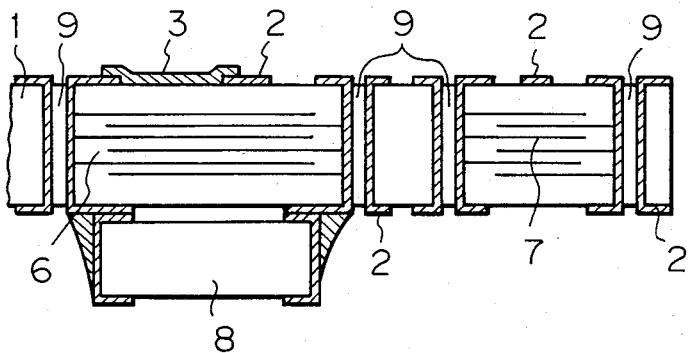
Figure 3:
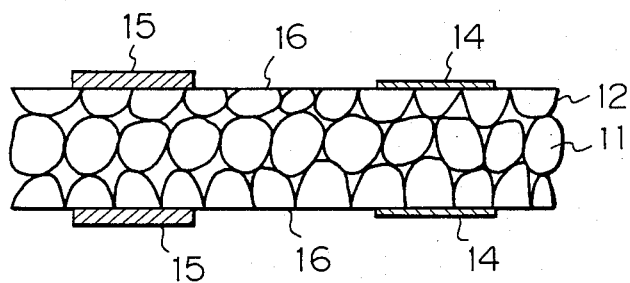
FIGS. 3 and 4 are for explaining an example of preparing a functional substrate of the present invention.

FIG. 3 illustrates a structure of the semiconductive ceramic substrate thus obtained where substrate 12 is made of oxide or compound oxide particle 11 rendered semiconductive.

Figure 4:
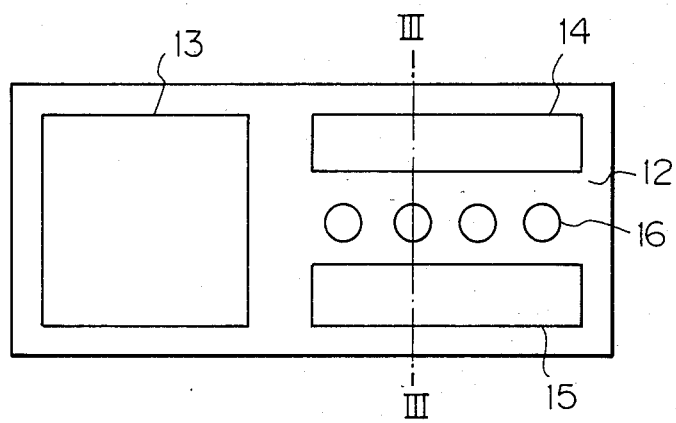

To render the semiconductive ceramic substrate dielectric, there can be used a metal or metal compound as a diffusion source for forming a capacitor-constituting unit, for example, Bi, $CuO$, $MnO_2$, $BaMnO_4$, $KMnO_4$, $Tl_2O_3$, $Fe_2O_3$, and the like being used. The functional substrate according to the present invention can be produced, for example, by preparing a coating liquid of the metal or metal oxide, and forming plural patterns according to the number of the desired capacitor-constituting-units by applying the coating liquid to one or both of the main surfaces of substrate 11 as shown in FIG. 3 and FIG. 4 to form a desired number of diffusion source layers 13,14 and 15 isolated from one another on the surface of the substrate. In FIG. 3 and FIG. 4, numeral 16 represents a through-hole portion.

Ceramic substrate 12 on which diffusion source layers are formed then undergoes firing in an oxidizing atomosphere by a conventional method of manufacturing ceramic capacitors, and consequently, by intergranular diffusion from the diffusion sources, insulating layers 17 and 18 are formed at the boundary between particles 11, and plural capacitor-constituting units 19 and 20 are formed in accordance with the number of the formed diffusion source layers. The kinds of diffusion sources used in this procedure are not critical, and may be similar or dissimilar.

Further, the number of formed capacitor-constituting unit is not restricted.

When, for example, a $BaTiO_3$ ceramic substrate doped with $Dy_2O_3$ and $SiO_2$ is employed, and $CuO$, $MnO_2$ and $Tl_2O_3$ are used as diffusion source layers 13, 14 and 15 in FIG. 4, respectively, and it is fired at 1350° C. for two hours in air, the dielectric constants ($\epsilon$) of the thus formed capacitor units are 25,000 (KHz), 30,000 (KHz) and 40,000 (KHz), respectively. In addition, the values of tan $\delta$ the resistivities are different from one another. On the other hand, when diffusion source layer 13 is composed of $KMnO_4$ and diffusion sources 14 and 15 are composed of $BaMnO_4$, that is, the semiconductive ceramic substrate 12 is dipped in a $KMnO_4$ solution, masking the portion except pattern 13, and a $BaMnO_4$ solution is applied to patterns 14 and 15, followed by fired at 1300° C. for one hour, the dielectric constants ($\epsilon$) of the capacitor units thus formed are 40,000 (KHz), 35,000 (KHz) and 35,000 (KHz) respectively.

In firing, formation of dielectrics at the portion of through-hole 16 is prevented by keeping the portion from contacting air.

In addition, in manufacturing a semiconductive substrate, it is preferable that particles at the surface portion be small since minute electrodes or other circuit elements are attached and that particles inside of the substrate be large so that $\epsilon$ of a capacitor unit may be high. Furthermore, it is desirable that particles around through-hole portions and portions used as resistors be particularly small. As a means for rendering particle size small locally, it is possible that particle size is controlled by heating locally with a laser beam at the time of sintering or by punching locally before sintering.

Figure 5:
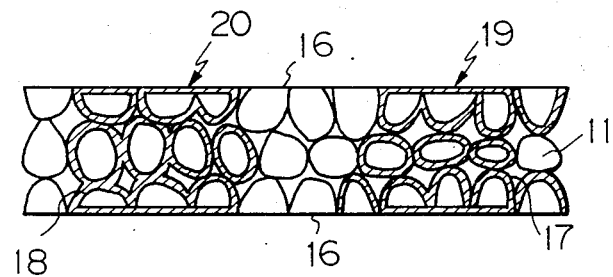
FIG. 5 is a sectional view which shows a structure of a functional substrate of the present invention produced according to the example of preparing as above.
Figure 6:
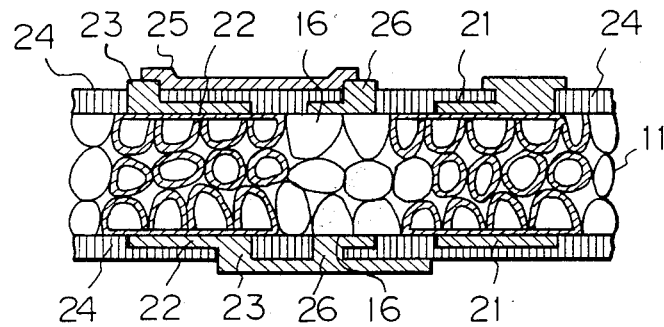
FIG. 6 is a sectional view of an electronic circuit substrate using the functional substrate in FIG. 5.

Although each capacitor unit is constituted of dielectrics of boundary layer type in the case of a functional substrate in FIG. 5, dielectrics of other type such as reoxidation type and the like may be also used.

An electronic circuit substrate using the functional substrate thus obtained of the invention can be fabricated by using, for example, the functional substrate in FIG. 5 and attaching at least electrodes 21 and 22 for capacitor units 19 and 20 and optionally attaching conductors 23, insulators 24, other circuit elements such as resistors 25, electrodes 26 for through-hole conduction and the like in the form of thick layer.

When the functional substrate and the electronic circuit substrate using that of the present invention are employed, plural electronic-part-constituting units separated from one another can be provided in one substrate, and the characteristics of each electronic-part-constituting unit such as $\epsilon$, tan $\delta$, resistivity and the like can be widely selected in the case of capacitor constituting units.

Furthermore, in a conventional laminated ceramic capacitor, it is sometimes observed that dielectric layers are connected and an accident such as signal leakage between adjacent circuit occurs. However, the functional substrate and the electronic circuit are advantageously almost free from such accident since capacitor units are well isolated from one another.

In addition, the functional substrate or electronic circuit substrate can be fabricated economically as compared with, for example, a conventional laminated ceramic capacitor especially when plural electronic-part-constituting units are formed, and contributes to miniaturization of electronic circuits and expansion of degree of freedom in electronic circuit designing.

What is claimed is:

1. A functional substrate produced by a process which comprises forming a diffusion source on the surface of a ceramic substrate for the fabrication of an electronic part, which ceramic substrate has been made semiconductive by sintering, and subjecting the ceramic substrate to a firing to provide plural electronic-part-forming units, isolated from one another, in the ceramic substrate.

2. A functional substrate according to claim 1 in which the diffusion source is metal or metal oxide.

3. An electronic circuit substrate which comprises a functional substrate produced by forming a diffusion source on the surface of a ceramic substrate for the fabrication of an electronic part, which ceramic substrate has been made semiconductive by sintering, and subjecting the ceramic substrate to a firing to provide plural electronic-part-forming units, isolated from one another, in the ceramic substrate, and at least electrodes for the electronic-part-forming units.

4. An electronic circuit substrate according to claim 3 in which the diffusion source is metal or metal oxide.

5. An electronic circuit substrate according to claim 3 in which the electronic part is a capacitor.

6. The substrate of claim 2 or 4 in which said metal is Bi.

7. The substrate of claim 2 or 4 in which said metal oxide is CuO.

8. The substrate of claim 2 or 4 in which said metal oxide is $MnO_2$.

9. The substrate of claim 2 or 4 in which said metal oxide is $BaMnO_4$.

10. The substrate of claim 2 or 4 in which said metal oxide is $KMnO_4$.

11. The substrate of claim 2 or 4 in which said metal oxide is $Tl_2O_3$.

12. The substrate of claim 2 or 4 in which said metal oxide is $Fe_2O_3$.

13. An electronic circuit substrate according to claim 3 in which the electronic part is a resistor.

14. An electronic circuit substrate according to claim 3 in which the electronic part is an insulator.

15. An electronic circuit substrate according to claim 3 in which the electronic part is a diode.

16. An electronic circuit substrate according to claim 3 in which the electronic part is a transistor.

* * * * *